United States Patent [19]

Lin et al.

[11] Patent Number: 5,045,921
[45] Date of Patent: Sep. 3, 1991

[54] PAD ARRAY CARRIER IC DEVICE USING FLEXIBLE TAPE

[75] Inventors: Paul T. Lin; Howard P. Wilson, both of Austin, Tex.

[73] Assignee: Motorola, Inc., Schaumburg, Ill.

[21] Appl. No.: 457,002

[22] Filed: Dec. 26, 1989

[51] Int. Cl.[5] .................... H01L 23/34; H01L 23/12; H01L 23/14

[52] U.S. Cl. .................... 357/74; 357/80; 357/81

[58] Field of Search .......... 357/80, 74, 72, 71, 357/81; 174/52.4

[56] References Cited

U.S. PATENT DOCUMENTS

| | | | |
|---|---|---|---|
| 4,691,225 | 9/1987 | Murakami et al. | 357/80 |
| 4,742,385 | 5/1988 | Kohmoto | 357/80 |
| 4,823,234 | 4/1989 | Konishi et al. | 357/81 |
| 4,831,495 | 5/1989 | Harding | 357/52.4 |
| 4,873,615 | 10/1989 | Grabbe | 357/80 |

Primary Examiner—Rolf Hille
Assistant Examiner—S. V. Clark
Attorney, Agent, or Firm—John A. Fisher; Jasper W. Dockrey

[57] ABSTRACT

An electronic pad array carrier IC device for mounting on a printed circuit board (PCB) or flex circuit substrate has a thin, flexible "tape" substrate having a plurality of traces. The substrate may be a polyimide or other material that can withstand relatively large lateral mechanical displacement. An integrated circuit die is mounted in proximity with or on the substrate and electrical connections between the integrated circuit chip and the traces are made by any conventional means. The substrate traces are provided at their outer ends with solder balls or pads for making connections to the PCB. A package body covers the die, which body may be optionally used to stand off the package a set distance from the PCB so that the solder balls will form the proper concave structure. Alternatively, a carrier structure may be provided around the periphery of the substrate to add rigidity during handling, testing and mounting, but which may also provide the stand-off function. The thin, flexible substrate can absorb a relatively large lateral or even vertical mechanical displacement over a rather large package area that may accommodate as few as 20 or as many 500 or more connections. The substrate may be optionally transparent or translucent to permit inspection of the bonds after mounting to the PCB. The PCB or flex circuit may also be transparent or translucent for bond inspection purposes. The solder pads or balls may be joined to a via through the substrate at least partially filled with electrically conductive material to permit back side testing of the carrier before or after mounting of the package to the PCB. Additionally, a heat sink structure may be directly bonded to the die in the pad array carrier IC device.

6 Claims, 2 Drawing Sheets

PAD ARRAY CARRIER IC DEVICE USING FLEXIBLE TAPE

CROSS-REFERENCE TO RELATED APPLICATION

This application is related to U.S. patent application Ser. No. 07/456,996, filed of even date, relating to integrated circuits in a plastic pad array electronic package that is relatively rigid, and more reliable and may be easily tested as compared with a device in a conventional package.

FIELD OF THE INVENTION

The invention relates to electronic devices, and, in one aspect, more particularly relates to packages and containers for electronic devices such as integrated circuits, for example, that require a large number of connections and which provide a mechanism for absorbing lateral displacement.

BACKGROUND OF THE INVENTION

It is well known that an increasingly important consideration in the production and use of integrated circuits (ICs) is the package in which the IC resides. The module or casing in which the IC is packaged is an important factor in the ultimate cost, performance and lifetime of the IC. For example, as ICs become more dense, dissipation of the thermal energy generated by them in an efficient manner becomes increasingly important in permitting their useful life to be as long as possible. Another consideration as the circuits become more dense is that the number of leads to the package and connections from the leads to the integrated circuit pads increases. This increases the complexity of construction and adds to the cost of the end product, not just in terms of increased and more expensive materials, but also increased production costs. A package which has satisfactorily addressed the need of a large number of interconnections is the pin grid array (PGA) where a plurality of pins oriented normal to a relatively flat package body gives a "bed of nails" appearance. PGAs have proven popular when connections numbering a few dozen to hundreds must be made.

Another factor affecting the design of IC packages is the advent of surface mount technology, whereby space is conserved on the PCBs by mounting the packages directly on the conductive patterns of the circuit board, rather than by extending the leads through holes in the board. This technology is an additional influence in making the packages smaller, and making it more difficult to design a small package that will dissipate thermal energy readily.

Thus, a continuing purpose in the art of providing packages for electronic components such as integrated circuits is a package design that will address these multiple goals satisfactorily in an arrangement that can be reliably manufactured at the lowest cost. The lowest cost packages relative to all package types, including ceramic, are those which have plastic bodies which can be molded or otherwise provided from thermoplastic and thermoset materials.

Addressing all of these goals has proven difficult. It has been hard to surface mount a package containing large numbers of leads; PGAs must either be mounted through holes in the PCB or in a carrier that is in turn surface mounted. Additionally, PGAs are generally made of expensive ceramic materials, rather than the less expensive plastic compounds. Further, a large PGA with a relatively rigid structure having 500 leads or pads or more would be subject to mechanical displacement over the package area as the PCB, and the package in turn is mechanically flexed or subjected to non-uniform heating that would cause one flat area of the package to expand at a rate different than an adjacent area of the package. Such stresses could cause bonds to come loose causing shorts or could crack the package body undesirably providing entry to moisture and other contaminants. Thus, the issues of very large pin counts, thermal dissipation, surface mounting and low cost are intertwined.

SUMMARY OF THE INVENTION

Accordingly, it is an object of the present invention to provide an improved integrated circuit design that will permit the IC device to have very large pin or connection counts, but remain flexible over its body to withstand lateral mechanical displacement due to thermal or physical causes.

It is another object of the present invention to provide an improved flexible IC device that permits a large number of connections that may be surface mounted to a PCB or flex circuit substrate.

Still another object of the invention is to provide an improved high "pin" count, surface mounted IC device which can be readily and reliably manufactured and inspected through a transparent or translucent substrate.

It is yet another object of the present invention to provide an improved large array surface mounted IC device that readily incorporates features to permit the stand-off height of the IC device package to be readily set.

In carrying out these and other objects of the invention, there is provided, in one form, an electronic IC device having an integrated circuit die with a plurality of bonding pads thereon, and a thin, flexible substrate having a plurality of traces thereon, where each trace has an inner bonding area and an outer bonding area. Electrical connections are provided between the bonding pads of the integrated circuit die and the inner bonding areas of the thin, flexible substrate. Solder balls are present on the outer bonding areas for eventual connection to the PCB. Finally, a package body is placed on or molded around the substrate that covers at least the integrated circuit die, the electrical connections and the inner bonding areas.

It will be appreciated in the Figures that the proportions of the various parts are not to scale. For example, the thicknesses of various components such as platings or coatings have been exaggerated for clarity.

DETAILED DESCRIPTION OF THE INVENTION

Figure 1:
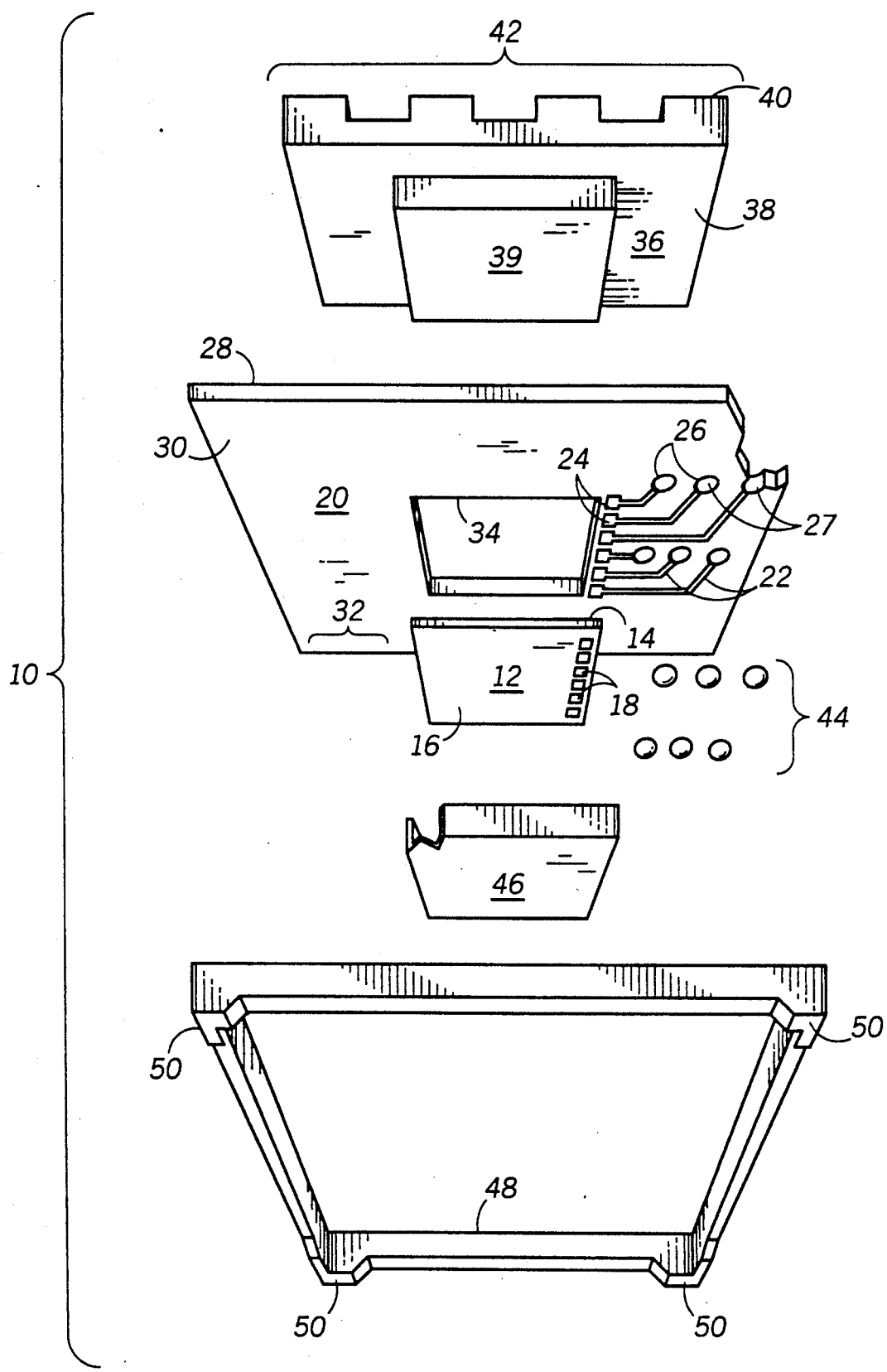
FIG. 1 is an exploded view of one aspect of an electronic device of the present invention as viewed from below.

Shown in FIG. 1 is an exploded view of one embodiment of the pad array carrier (PAC) electronic device 10 of the present invention, with some portions cutaway for clarity. The PAC device 10 has an integrated circuit die 12 having a back side 14 and an opposing front side 16 bearing a plurality of bonding pads 18 thereon. It will be appreciated throughout this disclosure that the number of bonding pads 18, bonding areas, connections, solder balls, etc. that represent a single electrical pathway are only illustrated with a few examples thereof for clarity. On an actual, complex die 12, there may now be as few as 20 and as many as 500 or more bonding pads 18.

An important part of the invention is the thin, flexible "tape" substrate 20 which has a plurality of traces 22 thereon, where each trace 22 has an inner bonding area 24 and an outer bonding area 26. Substrate 20 may be made of any flexible, insulative material, such as a thermoplastic or thermoset organic plastic that may withstand the assembly process, is fairly durable, and resilient to mechanical and thermal stress. Polyimide tape meets these requirements, and is well known as a substrate in tape automated bonding (TAB) technology. Other materials which may be suitable include, but are not limited to, epoxy materials, flex circuits and various PCB materials, some of which may be reinforced with fiber. Flex circuit substrates are thin, flexible substrates of various of these materials that serve the purpose of a PCB in some applications. The thickness of the tape substrate 20 may range from about 0.5 to about 20 mils, although these dimensions are merely given as examples only and are not meant as limiting, since it is certainly possible that substrates 20 outside these ranges, and even outside ranges normally though of as "tape" may be suitable for the requirements of these PAC IC devices 10. The traces 22 may be any suitable electrically conductive material, such as copper, aluminum, gold, alloys, etc. provided by conventional techniques such as plating, coating, etching, etc. Outer bonding areas 26 may optionally have vias 27 extending through substrate 20. Such via 27 may be filled with a conductive material such as solder (see FIGS. 2 and 3), which permits the integrated circuit die 12 and most partially assembled devices 10 as well as devices 10 mounted to a PCB to be tested conveniently at any stage in the assembly process or after.

The thin, flexible substrate 20 has a back side 28 and a front side 30, where the traces 22 are present on the front side 30 thereof. Front side 30 has a periphery 32 at its outer edge. Substrate 20 may also optionally have a cavity 34 for receiving the integrated circuit die 12. A die support structure 36 may be present, which die support structure 36 may also have a front surface 38 for holding and supporting integrated circuit die 12 in cavity 34, optionally by means of pedestal 39, and a back surface 40. Back surface 40 may be a heat dissipation surface 42, where the surface area is appreciably greater than the minimum needed for the shape of the structure 36. Heat dissipation surface 42 may be provided by a separate heat sink that is in turn adhered to the surface 40 of structure 36, in this version.

Figure 2:
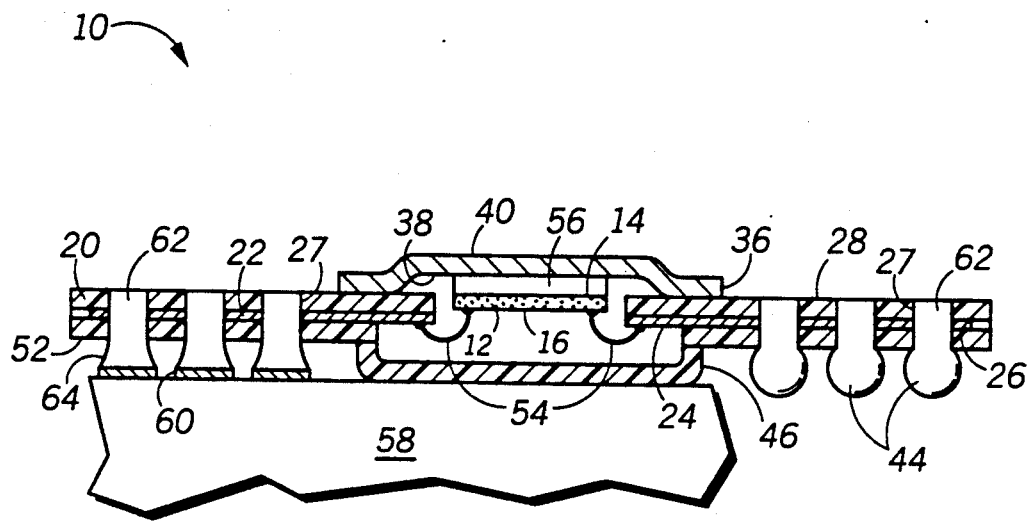
FIG. 2 is a cross sectional profile view of another form of the electronic device of the present invention somewhat different from that depicted in FIG. 1.

In one embodiment, as seen in FIGS. 1 and 2, the front surface 38 of die support structure 36 is attached to the back side 28 of substrate 20. This permits die 12 to be mounted on the front surface 38 or an optional pedestal 39 thereon. Depending on how the interconnection between die 12 bonding pads 18 and inner bonding areas 24 is to be conducted, the bonding pads 18 may need to be placed level with, above or below the inner bonding areas 24. In another optional embodiment, a die attach area may be present in between the die support structure 36 and the integrated circuit die 12. Or, as noted previously and illustrated in FIG. 3, no cavity 34 need be present and the die 12 may be mounted directly to a central portion of the insulative substrate 20.

Figure 3:
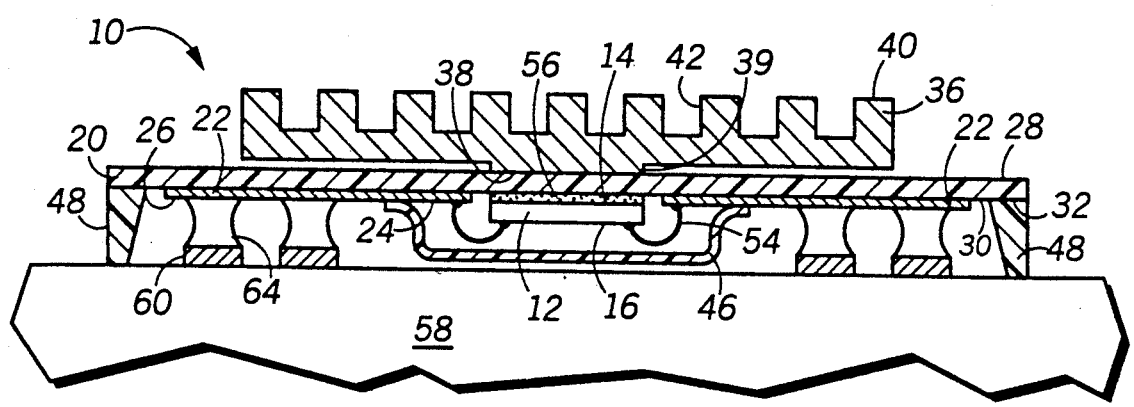
FIG. 3 is another cross sectional profile view of still another embodiment of the present invention, somewhat more similar to that seen in FIG. 1, as compared to the FIG. 2 package.

Electrical connections between the bonding pads 18 on integrated circuit chip 12 and inner bonding areas 24 are not shown in FIG. 1, although they are shown as conventional wire bonds in FIGS. 2 and 3. The interconnections may also be made by any conventional technique, such as bump bonding (used in "flip chip" orientations, which may also be used here) or tape automated bonding (TAB).

Another important part of the invention is the use of solder pads or balls 44 on the outer bonding areas 26 of substrate 20. If an electrically conductive material, such as solder, is present in vias 27, it should be in electrical connection with solder balls 44 to permit back- or topside testing as previously described. A package body 46 should also be present. Body 46 may be preformed and attached after the electrical connections to the chip 12 are made, or may be overmolded onto the chip 12 and substrate 20. In any event, it should cover at least the integrated circuit die 12, the electrical connections and the inner bonding areas 24. While the package body 46 is only shown on the bottom of IC device 10 in FIG. 1, a top portion of body 46 may be provided also on the back side 28 of substrate 20 by any conventional technique, such as overmolding, etc. However, if a heat dissipation surface 42 is desired to be employed, the IC device 10 should be designed so that the heat dissipation surface 42 is as close as possible to the integrated circuit die back side 14; that is, the heat dissipation surface 42 should be as intimately contacted with the heat source (chip 12) as possible.

A support or carrier structure 48 may be provided on the periphery 32 of front side 30 of substrate 20, as depicted in FIG. 1. However, the structure 48 can just as readily be provided on the periphery of back side 28 as it may on front side 30; it may be present on both sides. Such support structure 48, which is optional, will help provide rigidity to the outer edge of substrate 20 which is more prone to bending or other damage as the IC device 10 is handled and mounted to the PCB. Support structure 48 will also permit the IC devices 10 to be handled much more easily. The support structure 48 may be made thick enough to support the substrate 20 a desired predetermined distance from the PCB when device 10 is mounted thereon. If the entire structure 48 is not desired to provide this "stand-off" characteristic, the corners or other portions may be provided with stand-off features 50. It is expected in one aspect that structure 48 may be provided on the back side 28 of substrate 20, while stand-off structures 50 are provided on the front side thereof. Package body 46 itself may serve this spacing role, about which more will be said later. Support structure 48 need not be in the ring shape shown in FIG. 1, although it is preferably at the periphery 32 so as to not interfere with the bonding connections. Furthermore, support structure 48 may be made simultaneously with the package body 46, that is, they both may be overmolded. Alternatively, support structure 48 may be a premolded part that is placed separately or together with package body 46.

In the assembly procedure for IC device 10, integrated circuit die 12 is bonded by its back side 14 directly to a die attach area (not shown), the front surface 38 of die support structure 36 (if cavity 34 is present) or the substrate 20 itself (if cavity 34 is not present). If a die attach area or a die support structure 36 is used, the die attach area or support structure is now mounted by its front surface to the back side 28 of substrate 20. Next, the bonding pads 18 on front side 16 of die 12 are electrically connected to the inner bonding areas 24 of traces 22 by any suitable mechanism including, but not limited to, wire bonds, TAB structures, bump bonds, etc. The package body 46 is now provided, such as by overmolding or other technique. Body 46 may be cast over the central part of the substrate 20 illustrated in FIG. 1 so long as at least die 12, electrical connections and inner bonding areas 24 are covered.

Vias 27 may have already been provided at the outer bonding areas 26 on the substrate 20 or may now be provided, if desired. If vias 27 are present, they may be substantially (more than 50%) filled with an electrically conductive material, such as solder, copper, etc. Alternatively, vias 27 may be provided or filled with a relatively small amount of conductive material and still be effective mechanisms for testing, etc. For example, vias 27 could be barrel plated or coated in a thin area on the surface of the hole. Solder balls or pads 44 are now provided on bonding areas 26, and such solder balls 44 must be in electrical connection with the electrically conductive material in vias 27, if present. If a heat dissipation surface 42 has not already been provided as part of the die support structure 36, one may be provided now.

The assembled device is now flipped over in its orientation onto the PCB or flex circuit and heated to make connections to the lands on the PCB by reflowing the solder balls 44. In one embodiment of the invention, substrate 20 is made of a transparent or translucent material so that solder bonds to the PCB may be inspected by viewing the device from above. If bond inspection is to be done on an IC device 10 that will have a heat dissipation surface 42, then heat dissipation surface 42 should be designed in such a way that the view of the bonds is not obstructed, or surface 42 should not be placed on the device 10 until after the bonds are inspected. Alternatively, or additionally, the flex circuit upon which the device is mounted may also be transparent or translucent to facilitate bond inspection.

Mounted electronic devices 10 of this invention may be viewed more readily in FIGS. 2 and 3, although the FIGS. 2 and 3 embodiments are not identical to that seen in FIG. 1. The parts of the embodiments of the invention seen in these Figures will have similar reference numbers to those used in FIG. 1, although they may differ slightly in appearance or design. Some features previously discussed are not present here to illustrate that various versions of the inventive package may be accommodated.

For example, FIG. 2 illustrates an electronic IC device 10 having an integrated circuit die 12 with a back side 14 and a front side 16. Bonding pads 18 are not visible since they are seen edge-on. Thin, flexible substrate 20 has a plurality of traces 22 seen only edge-on, having inner bonding areas 24 and outer bonding areas 26. The FIG. 2 embodiment has vias 27 extending through substrate 20. Substrate 20 has an additional layer in the form of trace protective structure 52 which at least partially covers traces 22 and seals them to prevent deterioration from corrosion, shock or other effect.

Integrated circuit die 12 is mounted via its back side 14 by an adhesive layer 56 to the front surface 38 of die support structure 36, which also has a back surface 40, but no heat dissipation surface 42. Note also that front surface 38 is bonded to the back side 28 of substrate 20. In this embodiment, the surface of die 12 is above the surface of traces 22, as depicted in FIG. 2. Wire bonds 54 connect the bonding pads 18 with the inner bonding areas 24 of traces 22. The integrated circuit die 12, the wire bonds 54 and the inner bonding areas 24 are all sealed by package body 46 which may be overmolded or a separate piece affixed as illustrated in FIG. 2.

Shown on the right side of FIG. 2 is how this embodiment of the invention would appear before it is bonded to printed circuit board (PCB) or flex circuit 58 having a plurality of traces 60 thereon. Solder balls 44 may be seen in place on the outer bonding areas 26 on the bottom of vias 27. Vias 27 are filled with a conductive material 62 in electrical connection with the solder pads or balls 44. Conductive material 62 may be solder or some other suitable material. Thus, before or after mounting of device 10 on PCB 58, the package may be tested by probing the top of open vias 27 and conductive material 62.

In the mounting procedure, device 10 bearing solder balls 44 is placed on PCB 58 with balls 44 in alignment with traces 60. Flux or adhesive may be provided, for example on the "cap" of package body 46, to hold the device 10 in place during the solder reflow step whereby the device 10 and at least the facing side of the PCB 58 are heated to a temperature high enough to reflow solder balls 44. Because the solder will preferentially wet the traces 60 rather than the dielectric PCB 58 substrate, the solder balls 44 will reform into the connecting bonds 64 depicted on the left side of FIG. 2. Note that the bonds 64 have concave sides. This is a preferred shape of the connecting bonds 64, as opposed to a bond having straight walls or one having convex walls. The shape of these connecting bonds 64 is determined to at least some extent by the height of the bond which is called the "stand-off", i.e., the distance the lower most surface of the package—in this case the trace protective structure 52—is from the surface of the PCB 58. In the embodiment depicted in FIG. 2, the stand-off height is set by the design of package body or "cap" 46 which engages the surface of PCB 58. As noted previously, if substrate 20, and trace protective structure 52 as well, are transparent, then connecting bonds 64 may be visually inspected from above for quality. A stand-off feature may cause strain on the solder joints in the "z"-direction, i.e., normal to the flex circuit or PCB, but the flexible substrate 20 is expected to accommodate this strain better than a rigid substrate equivalent with less give.

Still another embodiment of the present pad array carrier invention is illustrated in FIG. 3 which depicts an IC device 10 having an integrated circuit die 12 with a back side 14 and a front side 16 bearing a plurality of bonding pads 18 (not shown in this view). In this aspect, substrate 20 has no cavity 34 to accommodate die 12, but instead is a solid piece to support the die 12 directly thereon by its back surface 14 using an adhesive 56. If a back side connection to the die 12 is desired, a trace 22 (not shown) may be provided to electrically connect with the back side 14 in a manner conventionally known.

Substrate 20 is otherwise as described in the FIGS. 1 and 2 embodiments in that it has traces 22 seen edge-on on the front side 30 of substrate 20 and a back side 28 which may be bonded to the front surface 38 of die support 36. In the FIG. 3 aspect, die support 36 does not directly contact die 12, but is nevertheless in close proximity thereto to serve the function of channeling thermal energy therefrom via heat dissipation surface 42 on back surface 40 of the die support structure 36. If the version of heat dissipation surface 42 depicted in FIG. 3 is employed and the bonds 64 are also to be inspected, it is apparent that die support structure 36 should not be mounted on the back side 28 of substrate 20 until after the connecting bond 64 inspection is made. Further, it is noted that only a small central portion, pedestal 39, of the front surface 38 of die support structure 36 contacts substrate 20, just the portion across from die 12. There is an air gap elsewhere between support structure 36 and substrate 20. This configuration ensures that the thermal energy generated by die 12 is removed by the most direct, and therefore efficient, path.

The substrate 20 in FIG. 3 also has inner bonding areas 24 and outer bonding areas 26 on each trace 22. Note that in this version, outer bonding areas 26 do not also possess vias 27. Nonetheless, connecting bonds 54 to the traces 60 on PCB 58 may still be visually inspected through the optionally transparent substrate 20. Inner bonding areas 24 are electrically connected to bonding pads 18 by conventional mechanisms, such as wire bonds 54. Package body 46 should also be provided to protect die 12, bonds 54 and inner areas 24 from physical damage prior to mounting, as well as for protection from the environment after PCB 58 mounting. However, in the FIG. 3 embodiment, package body 46 does not provide the stand-off function. Rather, the proper height for correct bond 64 shape is provided by optional support or carrier structure 48 on the periphery 32 of front side 30 of substrate 20. Of course, besides the stand-off function, the carrier structure 48 also provides rigidity to the outer edge of the package during handling, testing and mounting. This rigidity reduces the chance that damage may come to the relatively delicate solder balls 44 and die 12. Structure 48 would also limit damage or deformation to the planarity of the substrate 20 and traces 22. Support structure 48 may additionally optionally encircle the interior portions of the device 10 to provide further protection from the environment. Note that trace protective structure 52 is not present in this version.

In all of the embodiments of the invention, those depicted and those anticipated, it will be appreciated that the pad array carrier structure using the flexible substrate 20 will permit a large area package with many leads or pads, as many as 500 or more, to be easily made and mounted. An important feature is that as the device 10 is subjected to physical and thermal stresses during handling, mounting and operation, the flexible substrate 20 will be able to tolerate the mechanical displacement across the surface of the device 10. This displacement will increase with increasing lead or pad count and increasing substrate 20 surface area. Because the PCB 58 itself may be made from a similar material as substrate 20, the thermal expansion rates of the two materials may be designed to be closely matched to reduce the lateral stress. It is also apparent that these IC devices 10 may be made for a relatively low cost; certainly as compared with ceramic PGAs. The packages of this invention are also designed for surface mounting, unlike PGAs. Additionally, photolithographic techniques may be used in the fabrication of the substrates 20, and multilayer interconnection may also be easily adapted to this device 10 by using multiple substrates 20.

Many modifications may be made in the structure and process of the present invention without departing from the scope of thereof. For example, the various features of the invention may be combined in a way not explicitly illustrated herein. Although TAB interconnection is not explicitly shown, it may certainly be used. The packages of this invention may also be mounted using hot thermode board mounting techniques, or if open vias are employed, point-to-point localized laser fusing techniques could be used to make each of the pad connecting bonds. Accordingly, it is intended to include within the invention all such modifications as fall within the scope of the appended claims.

We claim:

1. An electronic pad array carrier IC device for mounting on a printed circuit board (PCB) or flex circuit substrate comprising:
   an integrated circuit die having a plurality of bonding pads thereon;
   a thin, flexible tape substrate having a thickness less than about 0.5 mm and having
      a plurality of traces thereon wherein each trace is visible through the substrate and, where each trace has an inner bonding area and an outer bonding area, where the outer bonding areas each additionally comprise a via through the thin, flexible tape substrate; and
   a cavity for receiving the integrated circuit die;
   a die support structure bonded to the back side of the thin, flexible tape substrate, the die support structure having
      a front surface holding the integrated circuit die in the cavity; and
      a back surface opposite the front surface;
   electrical connections between the bonding pads of the integrated circuit die and the inner bonding areas of the thin, flexible tape substrate;
   solder balls on the outer bonding areas; and
   a package body covering the integrated circuit die, the electrical connections and the inner bonding areas and attached to a portion of the tape substrate adjacent to the cavity, wherein the package body has a height to standoff the tape substrate from the PCB a predetermined distance and provides support for the tape substrate.

2. The electronic pad array carrier IC device of claim 1 where the back surface of the die support structure has a heat dissipation surface thereon.

3. The electronic pad array carrier IC device of claim 1 where a conductive material is present in the via in electrical connection with the solder ball on the outer bonding area.

4. The electronic pad array carrier IC device of claim 1 where a trace protective structure covers at least part of the traces between the inner bonding areas and the outer bonding areas.

5. The electronic pad array carrier IC device of claim 1 where
   the thin, flexible tape substrate has front side and a back side, where the traces are on the front side thereof; and a periphery is present on the front side and the back side of the thin, flexible tape substrate.

6. An electronic pad array carrier IC device to be mounted to a printed circuit board (PCB) or flex circuit substrate comprising:

- an integrated circuit die having a back side and an opposing front side, where the front side has a plurality of bonding pads thereon;
- at least one thin, flexible tape substrate having a thickness less than about 0.5 mm and having a back side and an opposing front side, including
  - a plurality of traces on the front side wherein each trace is visible through the substrate and, where each trace has an inner bonding area and an outer bonding area, where the outer bonding area comprises a via through the thin flexible tape substrate;
  - a periphery on the front side of the thin, flexible tape substrate; and
  - a cavity for receiving the integrated circuit die;
- a die support structure bonded to the back side of the thin, flexible tape substrate, the die support structure having
  - a front surface holding the integrated circuit die in the cavity; and
  - a back heat dissipation surface opposite the front surface;
- electrical connections between the bonding pads of the integrated circuit die and the inner bonding areas of the thin, flexible tape substrate;
- solder balls on the outer bonding areas;
- a conductive material within the vias in electrical connection with the solder balls;
- a trace protective structure covering at least part of the traces between the inner bonding areas and outer bonding areas; and
- a package body covering the integrated circuit die, the electrical connections and the inner bonding areas and attached to a portion of the trace protective structure adjacent to the cavity, wherein the package body has a height to standoff the tape substrate from the PCB a predetermined distance and provides support for the tape substrate.

* * * * *